United States Patent
Hoppe et al.

(10) Patent No.: US 7,213,220 B2
(45) Date of Patent: May 1, 2007

(54) METHOD FOR VERIFICATION OF GATE LEVEL NETLISTS USING COLORED BITS

(75) Inventors: Bodo Hoppe, Tamm (DE); Christoph Jaeschke, Tuebingen (DE); Johannes Koesters, Well im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 170 days.

(21) Appl. No.: 11/009,350

(22) Filed: Dec. 10, 2004

(65) Prior Publication Data

US 2005/0138586 A1 Jun. 23, 2005

(30) Foreign Application Priority Data

Dec. 19, 2003 (EP) .................... 03104841

(51) Int. Cl.
*G06F 17/50* (2006.01)
(52) U.S. Cl. ................. 716/5; 716/4; 716/3
(58) Field of Classification Search ......... 716/5, 716/4, 3
See application file for complete search history.

(56) References Cited

U.S. PATENT DOCUMENTS

| | | | | |
|---|---|---|---|---|
| 5,452,239 A | * | 9/1995 | Dai et al. ................ | 703/19 |
| 5,493,508 A | * | 2/1996 | Dangelo et al. ............ | 716/5 |
| 6,145,117 A | * | 11/2000 | Eng .......................... | 716/18 |
| 6,190,433 B1 | * | 2/2001 | Van Fleet et al. ........... | 71/18 |
| 6,591,400 B1 | * | 7/2003 | Yang ........................ | 716/2 |
| 6,745,160 B1 | * | 6/2004 | Ashar et al. ............... | 703/14 |
| 2004/0107409 A1 | * | 6/2004 | Melham et al. ............ | 716/5 |

* cited by examiner

*Primary Examiner*—Sun James Lin
(74) *Attorney, Agent, or Firm*—Lynn L. Augspurger

(57) ABSTRACT

The present invention relates to the field of computer hardware locic circuits, and in particular to a method for verifying the proper operation of a digital logic circuit, and in particular to symbolic simulation of a gate-level netlist corresponding to said hardware logic circuit. In order to add a useful alternative in the field of functional, exhaustive simulation and of symbolic simulation, it is proposed to perform the steps of:

a) analyzing symbolic expressions visible at predetermined locations within said logic;

b) determining, which nets in the netlist carry complex symbolic expressions, which comprise more than one symbol;

c) replacing said complex expressions with a "crunched color", for cutting off said complex symbolic expression from further propagation through the netlist;

d) continuing said symbolic simulation including said crunched color information on predetermined nets.

15 Claims, 4 Drawing Sheets

METHOD FOR VERIFICATION OF GATE LEVEL NETLISTS USING COLORED BITS

1. BACKGROUND OF THE INVENTION

1.1. Field of the Invention

The present invention relates to the field of computer hardware logic circuits, and in particular to a method for verifying the proper operation of a digital logic circuit.

1.2. Description and Disadvantages of Prior Art

Digital logic circuits implement a predetermined logic function of a digital hardware, by processing some input bit vector for producing an output result. Such circuits represent the core of any computing processing unit. Thus, before a logic circuit, or "hardware design" is constructed in hardware, its respective logic simulation model must be tested and the proper operation thereof has to be verified with many different input settings. This is usually done in prior art with simulation of a so-called gate-level netlist. This gate-level netlist has a graph structure with Boolean gates as nets and nets as connecting arcs. Storage elements like latches can be built from Boolean gates and are commonly included as nets in a gate-level netlist. In the following, we assume that a latch is included as a possible net in a gate-level netlist. Also, the abbreviated term "netlist" may be substituted for "gate-level netlist". This gate-level netlist is representing the respective sections of the desired hardware circuit.

Assume, a simple exemplary circuit has a plurality of 16 input bits. Then, a plurality of 2 exp 16=65536 different input settings exist, which should be tested in total for correct operation of the circuit, or its logic model, respectively. This is already a time-consuming work, either done by a computer, but at least surveyed in critical points within the circuit by the hardware developer engineering team. Thus, this way of hardware verification is called "exhaustive" functional verification.

Today's hardware designs, however, are much more complex than the before-mentioned simple 16-bit circuit. Even single sections of a hardware design may comprise hundreds, or several thousands of input variables.

This enormous input bit setting space cannot be verified in such exhaustive way, covering for example a plurality of (2 exp 2500) different input settings, ie "stimuli", and their correct propagation through the gate-level netlist. Thus, a so-called "biased, random" verification is done, selecting some bit settings only, the propagation of which seems to touch at least some of the "problematic zones" in a hardware design. Such selection might be to select an input bit pattern consisting of only "0", one of only "1", (corner cases), and some randomly selected patterns in-between them, comprising both values. There are also variations in that type of methods in prior art, like "walking 1s", etc.

In summary, the drawbacks of exhaustive functional verification are:

The simulation runtime is very long due to an exhaustive set of stimuli.

In lots of cases it is a time-consuming work, to check that all possible combinations for example on a certain data path in a gate-level netlist are exercised, and that they work correctly. A full (complete) checking is difficult to perform, since a logic function does not necessarily generate signal level changes, when for example, only one bit is changed in relation to the preceding input bit pattern. This is due to restrictions in the testbench, when registers are being set and reset, but there are only special combinations allowed (i.e. writing zeros to a register that shows already only zeros).

An alternative for doing exhaustive, bit value oriented, functional simulation is the prior art "symbolic" simulation. Here, instead of bit values, symbols are propagated through the gate-level netlist. For example, a 2-input AND gate with input symbols "a" and "b" produces a result "a AND b". This short logic expression is then the input for another gate, thus, maybe "a AND b OR c" results after the next step in a selected path. A long path in the logic results in an expression of significant extent. If, further, some feedback loop connects between some net location and a preceding net location of the propagation path, such expression can easily "explode". This is a disadvantageous limitation of symbolic simulation or verification.

In summary, the drawbacks of "symbolic simulation" are:

First, only small designs can be verified due to the possible expression explosion.

Further, such expressions grow dynamically; therefore the simulation cannot be run on so-called hardware accelerators, i.e. on dedicated high-performance simulation servers. Further, as the symbols have no value, a regular, usual bit-value-based functional simulation cannot be carried out simultaneously, which is often strongly desired.

1.3. Objectives of the Invention

It is thus an objective of the present invention to provide a method for verification of logic circuits, which adds a useful alternative in the field of functional, exhaustive simulation and of symbolic simulation.

2. SUMMARY AND ADVANTAGES OF THE INVENTION

This objective of the invention is achieved by the features stated in enclosed independent claims. Further advantageous arrangements and embodiments of the invention are set forth in the respective subclaims. Reference should now be made to the appended claims.

According to a basic aspect of the present invention a method is disclosed for performing a functional verification of designed hardware logic circuits by performing a known symbolic simulation of a first gate-level netlist corresponding to said hardware logic circuit, which is characterized by the steps of:

a) analyzing symbolic expressions visible at predetermined locations within said logic,
b) determining, which nets in the netlist carry complex symbolic expressions, which comprise more than one symbol,
c) replacing said complex expressions with a "crunched color", for cutting off said complex symbolic expression from further propagation through the netlist,
d) continuing said symbolic simulation including said crunched color information on predetermined nets.

As a person skilled in the art may appreciate, according to the basic principle of the invention the regular above-mentioned functional bit simulation implemented in a simulator is basically enriched by adding a processing of so-called "colors" of bits. The regular bit value is used as the "polarity" of a color. A color may be understood as a symbol, with an additional behaviour according to the invention, that symbolic expressions with more than one symbol is transformed into a new symbol called "crunched color". A color is dedicated to identify a bit value in the simulation. According to this inventional approach, bits can have no color, a specific color, or a crunched color. "Crunched" color is associated with an expression having more than one logic symbol, for example two of them. In this case a symbolic expression of: 1_a & 1_b would be replaced by the expression 1_?, wherein the bit value "1" is combined with a crunched color symbolized in here by a "?", thus yielding "1_?".

Thus, if a net <X> in a gate-level netlist in a given simulation run is tagged according to the invention with a particular color, the simulator will propagate this color with the current bit value on the net <X> through the netlist. The color may undergo a change, e.g. colors will be removed or will be changed to crunched, if the expression contains more than one color, according to the gates visited in the netlist and values on the nets.

In other words, according to said basic approach of the present invention the before-mentioned problem of "explosion of symbolic expressions" can be avoided by using the color processing. Assume two bits, each colored with a different color, "passing" through a NAND2 gate, ie a NAND gate with two input bits. When this is recorded—amended according to the inventional principle—as an expression according to the conventions of a "symbolic simulator", the output bit of the gate is simply annotated with the "crunched" color. This way the general analytical capabilities of a "symbolic simulator" may be at least lost in part, but the data flow of bits in a netlist may still be verified, although the expression might explode, as described before in relation to prior art.

As such an expression explosion problem does not exist anymore, when using the inventional approach, the complexity of "colored bit simulation" can be bounded by a constant factor higher than regular functional bit simulation, in contrast to a potentially "exploding", actually exponential increase of complexity as present in symbolic simulation. Thus, the additional calculation load is tolerable in relation to the additional knowledge, which is gained by virtue of the invention's "colored bit" approach.

A logic table, which is described later on in more detail, may serve exemplarily as a definition for the color processing of a 2-input NAND gate. Following this scheme, all other Boolean functions can be deduced from such 2-input NAND gate.

According to a specific application of the invention, assuming a first net <X>, as discussed above, and showing some color, if exactly this color can be found somewhere else on a bit at a net <Y> in the netlist, in which the net <X> occurs, ie, if the polarity of the bit at net <X> has been inverted, one would have observed an inverted bit polarity at net <Y>.

According to another preferred aspect of the invention, the color of a bit is an additional bit attribute, so the regular, functional bit simulation is not influenced. The "colored bit" processing can even be left out or excluded for certain parts of the netlist without a major interest. Then, of course, the excluded nets are not allowed to be fed back into parts of the netlist dealing with colors.

Further, the symbolic simulation method enriched according to the invention may further be enhanced when combined with functional simulation, wherein said symbolic expressions are used in addition to bit values, wherein in the above-mentioned "cut-off step c) the crunched color and the bit value is stored. This is described further below in more detail. Of course, also other colors can also be stored along with the bit value.

The additional step of:

analyzing the color net information at predetermined net locations of the color network, is advantageous, because this color analysis enables for excellent applicability for a very broad variety of test situations, for example:

if a color being input at a particular input section of said logic circuit is visible in a output section, where it is not expected to be visible, it gives prove for that both sections are not separated logically from each other.

When further the number of bits used for the color code is preselected according to a specific verification purpose, then the advantage is achieved that the inventional method can be well adjusted to any applicational problem situation.

3. BRIEF DESCRIPTION OF THE DRAWINGS

The present invention is illustrated by way of example and is not limited by the shape of the figures of the drawings in which:

FIG. 1 to 3 are each schematic representations of a gate-level implementation of the processing of the color information for a 2-input NAND gate, wherein FIG. 1 is illustrates the first stage thereof, the color comparator, FIG. 2 the color multiplexor, and FIG. 3 the main color processing scheme;

4. DETAILED DESCRIPTION OF THE PREFERRED EMBODIMENT

Next, and before entering preferred embodiments of the invention, the inventional principle underlying to the various uses of the inventional method will be described in more detail by aid of a simple exemplary NAND2 gate, from which any other logic Boolean function can be derived. The details are shown along the logic function of the NAND2 gate for a colored bit simulation using a plurality of two colors, named "x" and "y".

TABLE 1

| A\B | 0 | 1 | 0_x | 1_x | 0_y | 1_y | 0_? | 1_? |
|---|---|---|---|---|---|---|---|---|
| 0   | 1 | 1   | 1   | 1   | 1   | 1   | 1   | 1   |
| 1   | 1 | 0   | 1_x | 0_x | 1_y | 0_y | 1_? | 0_? |
| 0_x | 1 | 1_x | 1_x | 1   | 1_? | 1_? | 1_? | 1_? |
| 1_x | 1 | 0_x | 1   | 0_x | 1_? | 0_? | 1_? | 0_? |
| 0_y | 1 | 1_y | 1_? | 1_? | 1_y | 1   | 1_? | 1_? |
| 1_y | 1 | 0_y | 1_? | 0_? | 1   | 0_y | 1_? | 0_? |
| 0_? | 1 | 1_? | 1_? | 1_? | 1_? | 1_? | 1_? | 1_? |
| 1_? | 1 | 0_? | 1_? | 0_? | 1_? | 0_? | 1_? | 0_? |

In the left most column, the input A is shown. In the top most row, the input B is shown. The cells in the table body contain the results of a NAND2 gate enriched with color processing capabilities using these inputs. Please not that 'x' and 'y' are two exemplary color codes. The table can be rewritten with any other two different color codes, for example 'a' instead of 'x' and 'b' instead of 'y'.

The displayed values have to be interpreted as follows:

TABLE 2

| Value | Interpretation |
|---|---|
| 0 | Bit value 0 without color |
| 1 | Bit value 1 without color |
| 0_x | Bit value 0 with color 'x' |
| 1_x | Bit value 1 with color 'x' |
| 0_y | Bit value 0 with color 'y' |
| 1_y | Bit value 1 with color 'y' |

TABLE 2-continued

| Value | Interpretation |
| --- | --- |
| 0_? | Bit value 0 with crunched color |
| 1_? | Bit value 1 with crunched color |

Figure 1:
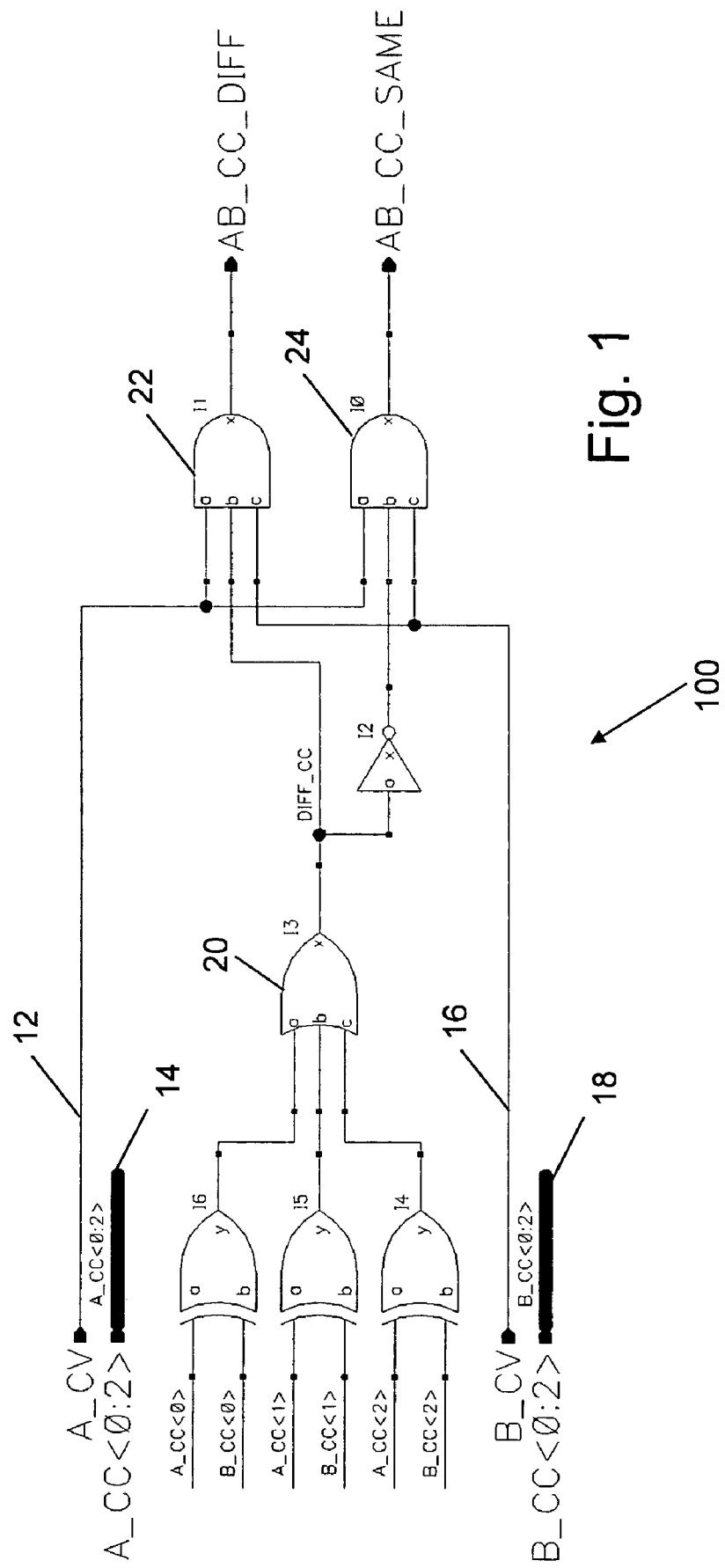

With general reference to the figures and with special reference now to FIG. 1 the following section describes a possible gate-level implementation of the processing of the color information for a 2-input NAND gate. It should be noted that any other logic functions can be derived from a NAND gate with 2 inputs.

Following an advantageous aspect of the present invention, the "color-related" logic described as follows is added to the original NAND gate. The color information of an exemplary net <NET> (a placeholder for a original net) is encoded advantageously into the following (by the color logic added) nets comprising colored nets:

1. Color Code Valid abbreviated as <NET>_CV: If 1, <NET> carries a valid color code information. If 0, it is either uncolored or the color is crunched.
2. Color Crunched abbreviated as <NET>_CX: If 1, <NET> carries a crunched color. If 0, it is either uncolored or it carries a valid color code.
3. Color Code abbreviated as <NET>_CC: This is a vector of nets specifying the color code. The color code is valid only if <NET>_CV is 1.

From the above descriptions, Nets <NET>_CV and <NET>_CX are mutually exclusive, meaning only one of them is 1 at the same time. The width of the vector <NET>_CC is parameterizable. It depends on bow many colors should be represented in the logic to investigate. The following example has a 3 bits wide vector <NET>_CC and is therefore capable to encode 8 different colors. The color logic internal net <NET>_V is directly connected to the original net <NET>.

The encoding of the color information for each original net to be used with the exemplary 2-input NAND color logic is shown in table 3. The 8 different colors, which can be encoded are 'a' to 'i'. For the value interpretation, see table 2. The color code column shows 'XXX' for rows, where <NET>_CV is 0, because the color code is irrelevant in this case. The 'XXX' can be replaced by any value, for example 000.

TABLE 3

| Value | <NET> | <NET>_CX | <NET>_CV | <NET>_CC |
| --- | --- | --- | --- | --- |
| 0 | 0 | 0 | 0 | XXX |
| 1 | 1 | 0 | 0 | XXX |
| 0_a | 0 | 0 | 1 | 000 |
| 1_a | 1 | 0 | 1 | 000 |
| 0_b | 0 | 0 | 1 | 001 |
| 1_b | 1 | 0 | 1 | 001 |
| 0_c | 0 | 0 | 1 | 010 |
| 1_c | 1 | 0 | 1 | 010 |
| 0_d | 0 | 0 | 1 | 011 |
| 1_d | 1 | 0 | 1 | 011 |
| 0_e | 0 | 0 | 1 | 100 |
| 1_e | 1 | 0 | 1 | 100 |
| 0_f | 0 | 0 | 1 | 101 |
| 1_f | 1 | 0 | 1 | 101 |
| 0_g | 0 | 0 | 1 | 110 |
| 1_h | 1 | 0 | 1 | 110 |
| 0_i | 0 | 0 | 1 | 111 |
| 1_i | 1 | 0 | 1 | 111 |
| 0_? | 0 | 1 | 0 | XXX |
| 1_? | 1 | 1 | 0 | XXX |

Figure 2:
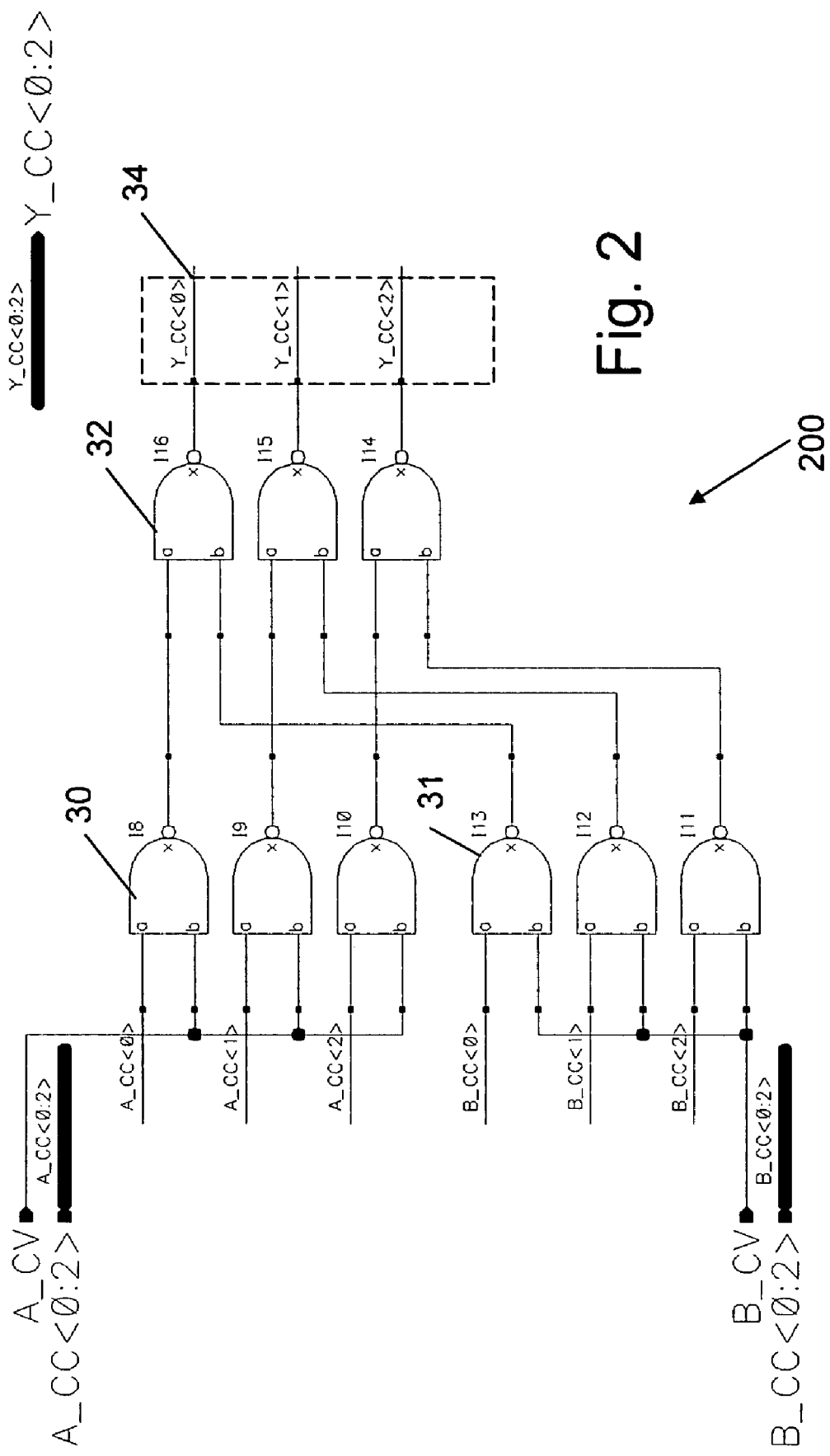
Figure 3:
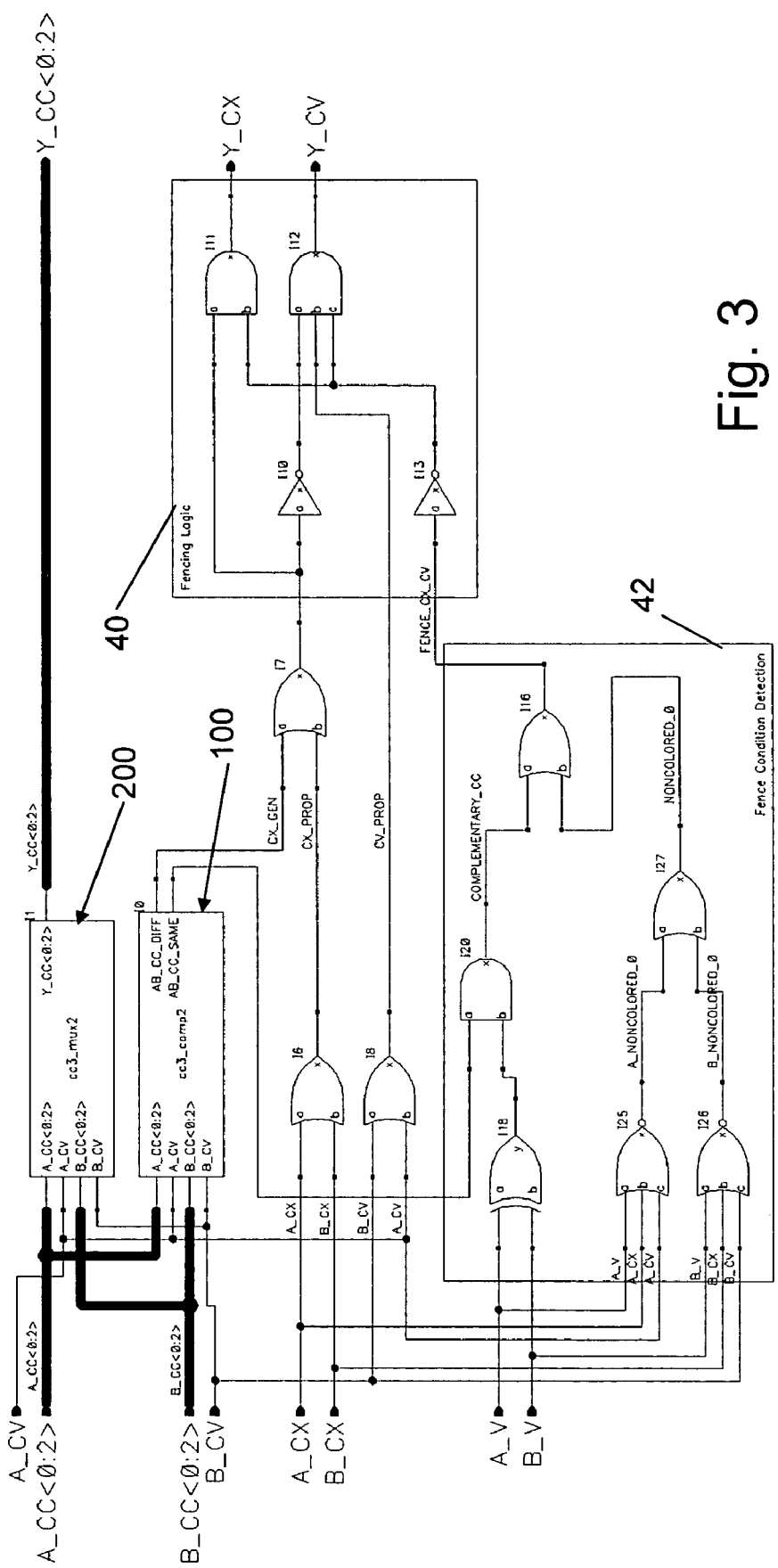

With reference to FIGS. 1, 2 and 3, respectively, according to a preferred aspect of the invention, the color logic can be divided into three different parts:
1. Color Code Comparator, see FIG. 1;
2. Color Code Multiplexor, see FIG. 2;
3. Main Color Processing, see FIG. 3.

First, the structure and function of the Color Code Comparator part will be explained in more detail.

Color Code Comparator:

The color code comparator part, denoted as a whole as 100, compares the color code information of the inputs A and B of the NAND2. A possible gate-level implementation is shown in FIG. 1.

As the color code information is encoded in the <NET>_CV and <NET>_CC nets only, the inputs A_CV 12, A_CC 14, B_CV 16 and B_CC 18 are the sole inputs to this logic.

The gates I4 to I6 compare each bit contained of the A_CC vector (A_CC<0:2>) with the corresponding bit of the B_CC vector (B_CC<0:2>). For example, I6 compares A_CC<0> with B_CC<0>. If any of the three comparisons detects a difference, I3 will flag this condition due to gate 20 on the net DIFF_CC with a 1.

The comparison results are valid only if both color codes are valid, meaning A_CV and B_CV are both 1. The output AB_CC_DIFF is thus set to 1 by the gate 22 I1 only, if there is a color code difference (DIFF_CC is 1) and both colors are valid (A_CV and B_CV are both 1).

The output AB_CC_SAME is set to 1 by the gate 24 I0 if both color codes are valid (A_CV and B_CV are both 1), and if there is no difference in the color codes (deduced from net DIFF_CC inverted by gate I2).

Next, and with reference to FIG. 2, the structure and function of the Color Code Multiplexor part will be explained in more detail.

Color Code Multiplexor:

A possible gate-level implementation of the color code multiplexor is given in FIG. 2. The color code multiplexor denoted as a whole as 200, is responsible to forward either the color code A_CC<0:2> or B_CC<0:2> to the output Y_CC<0:2>. It does so by using 3 NAND gates for each bit of the color code. Bit 0 for example is processed as follows:

The forwarding is done by gate 30 I8 for A_CC<0>, if A_CV is 1. Similarly, this is done by gate 31 I13 for B_CC<0>, if B_CV is 1. The outputs of I8 and I13 are inverting, this way the "De Morgan" conversion rule can be applied to gate 32 I16, which effectively then behaves as a simple OR function for the non-inverted outputs of gates 30, 31, denoted as I8 and I13, respectively.

Contemplating the overall function of the color code multiplexor, four different cases can be distinguished:
1. A_CV is 0 and B_CV is 0: The output 34 Y_CC<0:2> is '000', regardless of the inputs A_CC<0:2> and B_CC<0:2>.
2. A_CV is 1 and B_CV is 0: The output 34 Y_CC<0:2> is equal to A_CC<0:2>, regardless of input B_CC<0:2>.

3. A_CV is 0 and B_CV is 1: The output 34 Y_CC<0:2> is equal to B_CC<0:2>, regardless of input A_CC<0:2>.
4. A_CV is 1 and B_CV is 1: The output 34 Y_CC<0:2> is equal to an inputs A_CC<0:2> and B_CC<0:2> OR'ed together for each bit position separately. Thus, if A_CC<0:2> and B_CC<0:2> are equal, the output 34 Y_CC<0:2> is equal to A_CC<0:2> and B_CC<0:2>.

The output 34 Y_CC<0:2> in case 4 above is only used in the enclosing main color processing in the described special case of equality of A_CC<0:2> and B_CC<0:2>.

Next, and with reference to FIG. 3, the structure and function of the Main Color Processing part will be explained in more detail.

Main Color Processing:

A possible gate-level implementation of the top-level logic uses the color code comparator and the color code multiplexor in the way it is shown in FIG. 3.

The color code multiplexor 200 (CC3_mux2) as well as the color code comparator 100 (cc3_comp2) are connected directly to the color code information of the A and B inputs (A_CV, A_CC<0:2>, B_CV, B_CC<0:2>). The color code multiplexor output Y_CC<0:2> is directly connected to output Y_CC<0:2> of this main color processing logic.

The output AB_CC_DIFF of the color code comparator is connected to net CX_GEN on this level. This net flags that a crunshed color is presumably generated in the color logic. The net CX_PROP is yielded by ORing A_CX and B_CX by gate I6. It flags that a crunshed color is presumably propagated from any of the inputs A and B.

Gate I8 is OR'ing together inputs A_CV and B_CV, it output denoting that a valid color code is presumably flagged at the color logic output.

The block 40 denoted as "Fencing Logic" is responsible to decide, if these former described presumptions hold or not. It decides based on the net FENCE_CX_CV from the block 42 denoted as "Fence Condition Detection" using the gates I11, I12 and I13. It further makes sure by gate I10 and I12, that the output Y_CV is 0, if a crunshed color condition is set at output Y_CX.

The logic inside the block 42 "Fence Condition Detection" checks for two conditions:
First, the same colors are present at inputs A and B by using output AB_CC_SAME of cc3_comp2 and they have a different polarity by XOR'ing inputs A_V and B_V by gate I18. This condition describes the situation that the inputs will switch in a complementary way, so all the time the one input is 0 and the other one 1. The condition is flagged at the output of I20 at the net COMPLEMENTARY_CC.
Second, an uncolored 0 is present at input A or B. This is checked by gates I25 and I26 with output nets A_NONCOLORED_0 and B_NONCOLORED_0. Both nets are OR'ed together by I27 with output net NONCOLORED_0. Both conditions are OR'ed together by gate I16, which drives the net FENCE_CX_CV input to the block "Fence Logik". So effectively, if any of the above two conditions holds, the color processing logic tells that no color comes out of the 2-input NAND by driving the Y_CX and Y_CV outputs to 0. Considering also the output of the regular NAND function, one can easily see that the overall output is an uncolored 0.

After having described the colored bit approach of the invention according to a specific example, an overview is given to the basic functional components of the inventional method. This is done exemplarily with reference to FIG. 4.

Figure 4:
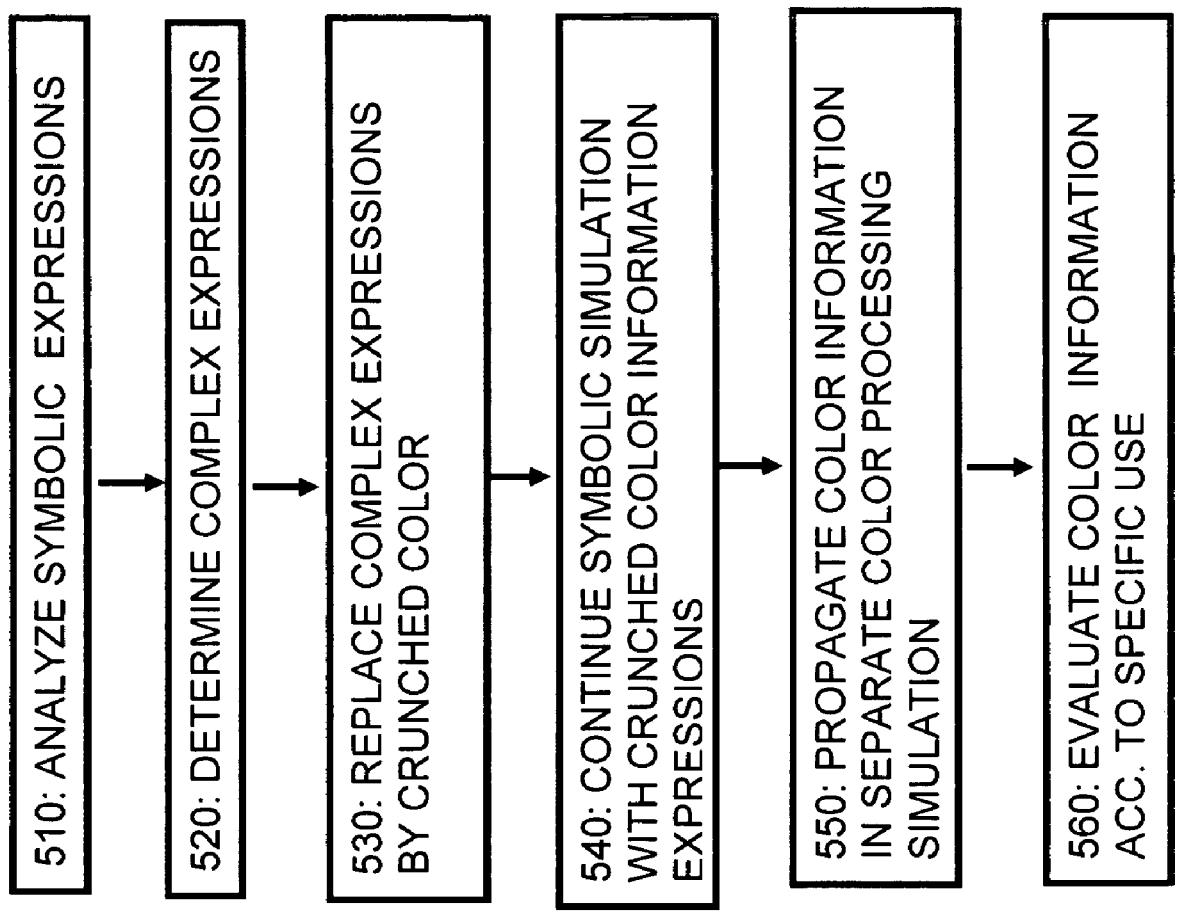
FIG. 4 is a schematic representation of the functional components playing important roles in the control flow of a preferred embodiment of the inventional method.

FIG. 4 is a schematic representation of the functional components playing important roles in the control flow of a preferred embodiment of the inventional method.

In a first step 510, the symbolic expressions are analysed. This is done according to prior art symbolic simulation at every interesting net in a netlist.

In a step 520 the complexity of such expression is determined. If it comprises more than one single variable, it is a "complex" expression according to the inventional teaching. For example, an AND gate processing two inputs may output the expression "A". As it comprises only a single symbol (logic variable), ie, A, it is considered as "not complex".

In another case, a different gate's output may be the expression "A AND NOT B". This is a complex expression, as it comprises more than one, ie a number of two variables, A and B.

In a next step 530 a complex expression is replaced by a crunched color denoted in here by "?". Should a functional simulation be performed in parallel, then for example "1_?" is stored at this net and state.

Then, in step 540 the simulation is continued including the crunched color information. Should a further third or fourth variable join a crunched color, the attribute "crunched" remains crunched. Thus, once crunched during propagation through the net, subsequent states of the same path remain crunched. Crunshed colors are removed from the evaluation path like regular symbols (or colors), if for example an AND gate has a non-symbolic (or uncolored) 0 on one of its other inputs. As step 550 indicates, the color processing is done in addition to a regular, (non-symbolic) simulation, advantageously also on a gate level base, in order to be able to use the same tools as for the logic circuit processing.

Finally, the color information can be evaluated in a step 560, according to a specific respective need of a respective application of the invention. Examples are given next below.
1. Checking the influence from one logic domain to another domain:

This can be verified using colored bits as a seamless extension to the already known multi-level simulation, where a logic net c can hold additional states other than the digital 0 or 1, i.e. X for 'unknown'.
The steps needed to be performed are:
a) identifying latches in the domain of interest and the latches surrounding this logic (i.e. by determining the fan-out of a clock tree);
b) coloring those latches;
c) running a normal functional simulation with color processing applying specific stimuli to the device under verification;
d) making sure that the color is still confined in the previously colored area, and that no additional nets hold this color information.

As one only needs to know if there is any influence from one net to another, only color processing for <NET>_CX must be added. There is no need to check if valid colors (<NET>_CV and corresponding nets <NET>_CC) are propagated.
2. This is essentially beneficial, if the logic to be confined is actually driving/controlling the actions of the hardware. The use of multi-level simulation does not deliver acceptable functional results because of its destructive nature. A concrete example for this type of application is to make sure that the logic controlling a prior art "Logic Built-in Self Test" (LBIST) is not contributing to the signatures that are used to check the result.

3. Scan order and connectivity verification:

This is usually done by a static check. The static check walks the netlist and fanout trees and tries to find a path from a net "a" to a net "b" under given constraints. The applications for this checking are usually very implementation-specific and in prior art generally need to know, how a specific latch is used in the scan path.

The advantage of the colored bit approach is that, once one has a program/utility driving the external scan data and clock signals, one can run this check without knowledge about internal details. One applies a new color on each scan clock on the scan data input. As soon as colored data is again arriving at the chip output, you can dump the color state of the latches and perform the following checks:

each color exists only once;
all colors applied can still be found.

If you put all latches into the order of externally applied colors, one will get the ordering of the scan ring.

4. Datapath/address propagation:

A convenient way to fully verify that the address/data propagation works fine, is:
a) coloring the input bits of the address/data with an individual color for each bit at the input;
b) checking for the correct propagation of all colors at the end of the address/datapath, i.e. from an address calculated to the according cache input address.

This overcomes limitations in prior art functional verification environments, i.e. only 46 bit addresses can be used, even if the particular design portion supports 64 bit addresses.

5. (De-) Serializer in non-encoded data transmission:

The correct ordering and the usage of the correct shift amount can be conveniently and completely verified running one testcase coloring each bit of the packet to be transmitted with an individual color, checking this order on the serial link and checking, if it is correctly deserialized on the other end transferring one packet.

6. Trigger/data capturing consistency:

Typically in hardware designs a debug capability is built-in, in order to capture trace data with a programmable trigger. To ensure that the right data is captured, the trigger as well as the resources to be captured in an array can be marked advantageously with colors. The position as well the correctness of the entry in the trace buffer can be fully verified that it matches the signals at the time the trigger is issued. This typically is a pervasive function that spans across big complex logic with multiplexers in-between, which would lead to very big equations or explosion in symbolic simulation, and which is very hard to fully verify in a functional verification environment due to signals being constant before or after the trigger at most times so misbehaving logic would not being completely verified.

7. Colored bits can help in getting a high-level overview when debugging a problem in a gate-level netlist.

Example: a processor executes instructions. Commonly these instructions have a well known high-level representation in assembler language. A testbench environment may decide about a specific instruction to be read by the processor model (gate-level netlist). The testbench constructs both, the binary representation for the regular netlist and the high-level representation for debugging purposes. The binary representation is given to the simulator as input stimuli of the gate-level net list. The colored bits capability here is then used to attach a unique color to all bits or to only a part of the binary representation of the instruction, in order to reference exactly the high-level representation generated correspondingly.

As the simulation proceeds, the user can read the color information from specific points in the processor gate-level net list and lookup the corresponding high-level representation. Due to the possibility to relate as much additional information as needed to a regular bit representation, debugging from a users viewpoint becomes very easy.

The present invention can be realized in hardware, software, or a combination of hardware and software. A tool according to the present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out these methods.

Computer program means or computer program in the present context mean any expression, in any language, code or notation, of a set of instructions intended to cause a system having an information processing capability to perform a particular function either directly or after either or both of the following
a) conversion to another language, code or notation;
b) reproduction in a different material form.

What is claimed is:

1. A method for performing a verification of a designed hardware logic circuit by a symbolic simulation of a gate-level netlist corresponding to said designed hardware logic circuit, which is characterized by the steps of:
   a) analyzing symbolic expressions visible at predetermined locations within said designed hardware logic circuit,
   b) determining which nets in the gate-level netlist carry complex symbolic expressions, which comprise more than one symbol,
   c) replacing said complex symbolic expressions with "crunched color" information representing an expression having more than one logic symbol, for cutting off said complex symbolic expression from further propagation through the gate-level netlist, and
   d) continuing said symbolic simulation including said crunched color information on predetermined nets.

2. The method according to claim 1, combined with a functional simulation, wherein said complex symbolic expressions are used in addition to bit values, wherein in step c) the crunched color information and the bit values are stored.

3. The method according to claim 1, combined with a functional simulation, wherein said crunched color information encodes further a bit value and additional meta-information about complexity of an expression.

4. The method according to claim 3, wherein a color processing comprises a color comparating portion, a color multiplexing portion.

5. The method according to claim 1, further comprising the step of:
   e) propagating said crunched color information in a separate color processing simulation of a respective separate color network derived from a network.

6. The method according to claim 1, further comprising the step of:

evaluating the crunched color information at predetermined net locations of a color network.

7. The method according to claim 1, wherein a color simulation is implemented on a gate net list.

8. The method according to claim 1, wherein a color simulation is performed with a hardware accelerator.

9. The method according to claim 1, wherein a color simulation is performed with a software simulator.

10. The method according to claim 1, wherein a number of bits used for the color code is preselected according to a specific verification purpose.

11. The method according to claim 1, wherein a color processing is performed only in a selected subsection of said designed hardware logic circuit.

12. A computer program product stored on a computer usable medium comprising computer readable program means for causing a computer to perform the steps of the method according to claim 1, when said computer program product is executed on a computer.

13. A computer system acting as a hardware simulation accelerator comprising a functional component for performing the steps of:

a) analyzing symbolic expressions visible at predetermined locations within a designed hardware logic circuit,
  b) determining, which nets in a netlist carry complex symbolic expressions, which comprise more than one symbol,
  c) replacing said complex symbolic expressions with a "crunched color" representing an expressions having more than one logic symbol, for cutting off said complex symbolic expression from further propagation through the netlist, and
  d) continuing a symbolic simulation including said crunched color on predetermined nets, when computer program code portions are executed on a computer.

14. A computer program for execution in a data processing system comprising a functional component for performing the steps of:

a) analyzing symbolic expressions visible at predetermined locations within a designed hardware logic circuit,
  b) determining which nets in a netlist carry complex symbolic expressions, which comprise more than one symbol,
  c) replacing said complex symbolic expressions with a "crushed colors" representing an expression having more than one logic symbol, for cutting off said complex symbolic expressions from further propagation through the netlist, and
  d) continuing a symbolic simulation including said crunched color on predetermined nets, when computer program code portions are executed on a computer.

15. A FPGA hardware circuit comprising a programmed hardware logic for implementing the steps of:

a) analyzing symbolic expression visible at predetermined locations within a designed hardware logic circuit,
  b) determining which nets in a netlist carry complex symbolic expressions, which comprise more than one symbol,
  c) replacing said complex symbolic expressions with a "crunshed color" representing an expression having more than one logic symbol, for cutting off said complex symbolic expressions from further propagation through the netlist, and
  d) continuing a symbolic simulation including said crunched color on predetermined nets.

* * * * *